United States Patent
Oohira et al.

[11] Patent Number: 6,163,069
[45] Date of Patent: Dec. 19, 2000

[54] SEMICONDUCTOR DEVICE HAVING PADS FOR CONNECTING A SEMICONDUCTING ELEMENT TO A MOTHER BOARD

[75] Inventors: Minoru Oohira; Kenji Ohgiyama; Teruhisa Fujihara, all of Isahaya, Japan

[73] Assignee: Mitsubishi Denki Kabushiki Kaisha, Tokyo, Japan

[21] Appl. No.: 09/070,724

[22] Filed: May 1, 1998

[30] Foreign Application Priority Data

Oct. 9, 1997  [JP]  Japan ................................. 9-277230

[51] Int. Cl.⁷ .......................... H01L 23/34; H01L 23/12; H01L 23/28; H05K 1/18
[52] U.S. Cl. .......................... 257/684; 257/698; 257/728; 257/724; 257/712; 257/796; 257/693; 257/786; 257/784; 257/774; 257/675; 257/787
[58] Field of Search ..................... 257/712, 666, 257/713, 675, 796, 680, 684, 690, 692, 698, 693, 701, 706, 707, 717, 720, 728, 724, 730, 774, 782, 787, 786

[56] References Cited

U.S. PATENT DOCUMENTS

| | | | |
|---|---|---|---|
| 5,115,300 | 5/1992 | Yanagida et al. | 257/724 |
| 5,157,480 | 10/1992 | McShane et al. | |
| 5,172,214 | 12/1992 | Casto | 257/676 |
| 5,285,352 | 2/1994 | Pastore et al. | |
| 5,309,322 | 5/1994 | Wagner et al. | 361/723 |
| 5,355,283 | 10/1994 | Marrs et al. | 362/760 |
| 5,422,615 | 6/1995 | Shibagaki et al. | 333/246 |
| 5,438,305 | 8/1995 | Hikita et al. | 257/728 |
| 5,438,395 | 8/1995 | Koga et al. | 399/284 |
| 5,521,429 | 5/1996 | Aono et al. | 257/676 |
| 5,583,377 | 12/1996 | Higgins, III | 257/707 |
| 5,625,222 | 4/1997 | Yoneda et al. | 257/687 |
| 5,689,138 | 11/1997 | Dekker et al. | 257/728 |
| 5,696,666 | 12/1997 | Miles et al. | 361/764 |
| 5,731,632 | 3/1998 | Kozono | 257/717 |
| 5,747,877 | 5/1998 | Wilson | 257/703 |
| 5,789,817 | 8/1998 | Richards et al. | 257/724 |
| 5,835,988 | 11/1998 | Ishii | 257/684 |
| 5,866,948 | 2/1999 | Murakami et al. | 257/778 |
| 5,894,108 | 4/1999 | Mostafazadeh et al. | 174/52.4 |
| 5,900,676 | 5/1999 | Kweon et al. | 257/787 |
| 5,905,304 | 5/1999 | Ewer et al. | 257/705 |
| 5,933,709 | 8/1999 | Chun | 257/712 |
| 5,942,796 | 8/1999 | Mosser et al. | 257/712 |
| 5,977,630 | 11/1999 | Woodworth et al. | 257/712 |
| 5,982,628 | 11/1999 | Houdeau et al. | 362/760 |

FOREIGN PATENT DOCUMENTS 62-25444  2/1987  Japan.

*Primary Examiner*—Alexander O. Williams
*Attorney, Agent, or Firm*—Oblon, Spivak, McClelland, Maier & Neustadt, P.C.

[57] ABSTRACT

Provide a discrete semiconductor device, particularly a discrete semiconductor device for small signal operation with a smaller packaging area and has excellent high frequency characteristics and good heat dissipation performance, and a method for producing the same. The discrete semiconductor elements are mounted on die bond pads and wire bond pads with the packaging surface being sealed with a resin, and connecting the back faces of the die bond pads and the wire bond pads directly to a mother board.

7 Claims, 17 Drawing Sheets

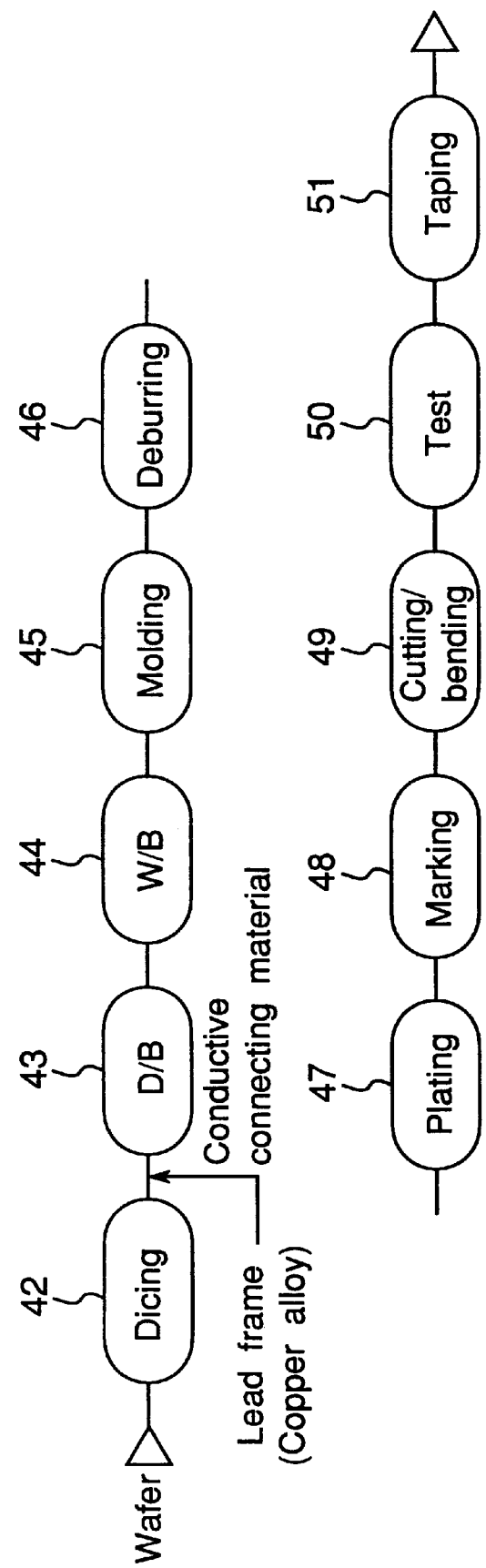
PRIOR ART Fig.27

SEMICONDUCTOR DEVICE HAVING PADS FOR CONNECTING A SEMICONDUCTING ELEMENT TO A MOTHER BOARD

BACKGROUND OF THE INVENTION

1. Field of the Invention

The present invention relates to a discrete semiconductor device. More particularly, it relates to a discrete semiconductor device for small signal operation having excellent high-frequency characteristics and heat dissipation performance.

2. Description of the Related Art

A discrete semiconductor device of the prior art is typically packaged in a DIP (dual inline package) shown in FIG. 25. FIG. 25A is a cut-away view from above of a resin-sealed DIP, and FIG. 25B is a cut-away view of the side of the resin-sealed DIP. In the drawing, numeral 2 denotes a sealing resin, 8 denotes a discrete semiconductor element, 9 denotes a wire connecting an electrode of the discrete semiconductor element 8 and an inner lead 39, 38 denotes an island for securing the discrete semiconductor element 8, 39 denotes the inner lead and 40 denotes an outer lead.

In the case of such a resin-molded DIP, the discrete semiconductor element 8 is secured onto the island 38 of a lead frame 41 by die bonding and the electrode of the discrete semiconductor element 8 is connected to the inner lead 39 by means of the Au wire 9, then the circuit is sealed with resin by using an independent die for each discrete semiconductor element 8, with the lead being cut off the lead frame 41 thereby to fabricate the discrete semiconductor device (FIG. 27).

When packaging the discrete semiconductor device on a mother board, there has been such a problem that a large packaging area is required to connect the device to the mother board by using the outer lead 40 which is installed on a side face of the package and extends outward.

Also because the discrete semiconductor element and the mother board are connected by means of a lead, wiring length becomes longer and causes a substantial loss in the discrete semiconductor element in high-frequency region which leads to unsatisfactory high frequency characteristics.

Moreover, because the discrete semiconductor element is sealed with a resin of low thermal conductivity, heat dissipation efficiency decreases and causes such a problem that it is impossible to package discrete semiconductor elements of high power.

For example, Japanese Patent Kokai Publication No. 8-236665 discloses a method of packaging electronic elements on a mother board by means of bumps provided on the back of a resinsealed semiconductor device which carries an IC chip mounted thereon, without using leads.

However, because the discrete semiconductor element employs a high power element such as power MOS device compared to an IC which employs a low power element, heat transfer through the bumps is not enough to dissipate the heat generated by the semiconductor device and the like. Also when high-frequency elements are used, it has been necessary to improve the high-frequency characteristics by making the distance between the electrode of the high-frequency element and the mother board whereon the high-frequency element is mounted as short as possible.

Moreover, in the process of producing resin-sealed discrete semiconductor devices of the prior art, semiconductor elements are sealed with resin by using an independent die for each discrete semiconductor device and injecting the sealing resin in each die, although such a method requires it to fabricate a new die every time the external dimension or profile of the semiconductor divide is changed, thus making it difficult to reduce the period of time and cost of development of the semiconductor devices.

Also when a lead frame is used, peripheral portion of the frame except for the leads becomes unnecessary making it difficult to reduce the producing cost.

SUMMARY OF THE INVENTION

The present invention is intended to solve the problems with the discrete semiconductor elements described above, and an object of the present invention is to provide a discrete semiconductor device which requires a small packaging area and has excellent high-frequency characteristics and good heat dissipation performance, and a method of producing the same.

The present inventors have intensively studied. As a result, the present inventors have found that it is possible to connect the back faces of die bond pads and wire bond pads directly on a mother board and to achieve the object described above, by using a discrete semiconductor device made by mounting the discrete semiconductor elements on the die bond pads and the wire bond pads and sealing the packaging surface with a resin. Thus, the present invention has been accomplished.

Hence the present invention provides a discrete semiconductor device comprising die bond pads and wire bond pads arranged at specified intervals, discrete semiconductor elements which are fastened on the back face thereof onto the die bond pads and have electrodes electrically connected to the wire bond pads, and a sealing resin provided on one side of the die bond pads and the wire bond pads thereby to seal the discrete semiconductor elements.

In the discrete semiconductor device as described above, one side of the discrete semiconductor device is not sealed with resin and the die bond pads and the wire bond pads on the back side which is not sealed with the resin allow direct connection with the mother board.

Therefore, firstly, packaging area can be reduced compared to the packaging technique of the prior art which uses leads, because the discrete semiconductor device has connecting points on the back. Also because the die bond pads and the wire bond pads provided on the back can be directly connected to the mother board by using solder or the like, packaging height can also be reduced compared to the configuration of the prior art which uses bumps.

Secondly, because the discrete semiconductor elements are directly fastened on the die bond pads while the die bond pads are connected directly to the mother board, efficiency of heat dissipation of the discrete semiconductor elements can be greatly improved compared to the configuration of the prior art which dissipates heat through the leads. This configuration makes it possible to use elements which generate much heat such as power MOS devices.

Thirdly, because the die bond pads and the wire bond pads are connected directly to the mother board, connection distance between the discrete semiconductor device and the mother board can be reduced, thereby making it possible to improve the high-frequency characteristics when the discrete semiconductor device is used in a high frequency band.

Also the present invention provides a discrete semiconductor device wherein the die bond pads and the wire bond pads are electrically conductive metal sheets which are fastened at specified positions on the back of an insulating sheet and have aperture in the insulating sheet on the metal sheets, and the sealing resin is provided on one side of the die bond pads and the wire bond pads thereby to seal the discrete semiconductor element.

This makes it easy to product a plurality of semiconductor devices at the same time.

Also the present invention provides a discrete semiconductor device wherein the die bond pads and the wire bond pads are the metal sheets which are cut off as born by the sealing resin that is formed on an electrically conductive metal sheet, and the sealing resin is provided on one side of the die bond pads and the wire bond pads thereby to fasten the die bond pads and the wire bond pads at specified intervals and seal the discrete semiconductor element.

By using the metal sheets formed at the specified intervals as the die bond pad and the wire bond pads as described above, it is made possible to manufacture the discrete semiconductor device having a plurality of semiconductor elements connected in series or parallel, having such a configuration as the wire bond pads are used in common.

The discrete semiconductor device preferably has electrodes on the back thereof and is electrically connected with the wire bond pads.

This is because the efficiency of heat dissipation can be improved and the wiring can be made shorter by fastening the discrete semiconductor element which has back side electrode directly on the conductive wire bond pad.

The discrete semiconductor element is preferably a diode or a transistor, and the metal sheet is preferably made of copper which has good electric conductivity and high heat conductivity.

The present invention also provides a discrete semiconductor device made by sealing the plurality of discrete semiconductor elements with the integral sealing resin.

The plurality of discrete semiconductor elements, having the die bond pads and/or the wire bond pads in common, are sealed with the integral resin by us.

This makes it possible to obtain the discrete semiconductor device of such a configuration as the discrete semiconductor elements are connected in series or parallel and are integrally sealed with the resin.

The present invention also provides a method for producing a discrete semiconductor device, comprising a step of forming the plurality of sets of die bond pad and wire bond pads by fastening electrically conductive metal sheets at specified positions on the back of an insulating sheet and making apertures in the insulating sheet on the metal sheets, a packaging step for fastening the back of the discrete semiconductor elements on the die bond pads and electrically connecting the electrodes of the discrete semiconductor elements and the wire bond pads, a step of sealing the plurality of the discrete semiconductor elements installed on the insulating sheet with an integral sealing resin by sealing the packaging surface of the insulating sheet with the resin, and a step of dividing the sealing resin into the discrete semiconductor devices by cutting off the sealing resin around the discrete semiconductor elements.

By employing such a producing method, use of a resin-sealing die for each discrete semiconductor device as in the prior art becomes unnecessary because a plurality of discrete semiconductor elements installed on the insulating sheet are sealed with an integral resin by using one die and then cut off to make the discrete semiconductor devices.

Therefore, when the dimension or profile of the discrete semiconductor element to be packaged is changed, profile of the sealing resin can be changed only by changing the position of cutting the sealing resin without changing the die.

With this method, period of time required for developing the discrete semiconductor device can be reduced and the developing cost can be reduced, of which effects become even more significant for discrete semiconductor devices which must be made in large variety, small lot production.

The producing cost can also be reduced because there is no unnecessary lead frame unlike in the case where lead frame is used.

The packaging step described above may also include a step of fastening the back side electrode of the discrete semiconductor device onto the die bond pad to electrically connect the die bond pad and the back side electrode.

The dividing step may also be a step of cutting off the sealing resin around a plurality of discrete semiconductor elements grouped as a single body, to obtain the discrete semiconductor device wherein the plurality of discrete semiconductor elements are sealed with the integral resin.

Such a step makes it possible to easily manufacture the discrete semiconductor device of such a configuration as the plurality of discrete semiconductor elements are sealed with the integral resin.

The present invention also provides a method for producing a discrete semiconductor device, comprising a packaging step wherein a plurality of discrete semiconductor elements are fastened, on the back thereof, onto an electrically conductive metal sheet and an electrode of each discrete semiconductor element is electrically connected to a specified position of the metal sheet, a step of sealing the packaging surface of the metal sheet with an integral sealing resin, a cut-off step of cutting off the metal sheet by cutting therein from the back thereby to turn the metal sheet into die bond pads and wire bond pads which are arranged at intervals, and a step of dividing the discrete semiconductor devices by cutting off the sealing resin around the discrete semiconductor elements.

With such a method, it is made possible change the profile of the sealing resin simply by changing the position of cutting off the sealing resin without changing the sealing die even when the dimensions or profile of the discrete semiconductor elements to be packaged is changed, and also to easily obtain the discrete semiconductor device of such a configuration as the discrete semiconductor elements are connected in series or parallel and are sealed with the integral resin.

The packaging step may also include a step of fastening the back electrode of the discrete semiconductor elements onto the metal sheet and electrically connecting the metal sheet and the back electrode.

The dividing step may also be a step of cutting off the sealing resin around a plurality of discrete semiconductor elements grouped as a single body, to divide the discrete semiconductor devices each carrying the plurality of discrete semiconductor elements being sealed with the integral resin.

Such a step makes it possible to easily obtain the discrete semiconductor device wherein the plurality of discrete semiconductor elements are sealed with the integral resin, without changing the resin-sealing die.

The cut-off step may also be a step of cutting off the metal sheet in such a way as the die bond pads and/or the wire bond pads connected to the plurality of discrete semiconductor elements become an integral body, and the dividing step may also be a step off cutting off the sealing resin around the discrete semiconductor elements which are formed so that the die bond pads and/or the wire bond pads connected to the plurality of discrete semiconductor elements become an integral body, thereby to obtain the discrete semiconductor device wherein the plurality of discrete semiconductor elements which share the die bond pads and/or the wire bond pads in common are sealed with the integral resin.

Such a method makes it possible to easily obtain the discrete semiconductor device of such a configuration as the plurality of discrete semiconductor elements are connected in series or parallel and are sealed with resin as an integral body, without changing the resin-sealing die.

BRIEF DESCRIPTION OF THE DRAWINGS

FIG. 27 shows the sequence of assembling steps for the discrete semiconductor device of the conventional configuration.

DESCRIPTION OF THE PREFERRED EMBODIMENTS

Embodiment 1

Now first embodiment of the present invention will be described below with reference to the accompanying drawings.

Figure 1:
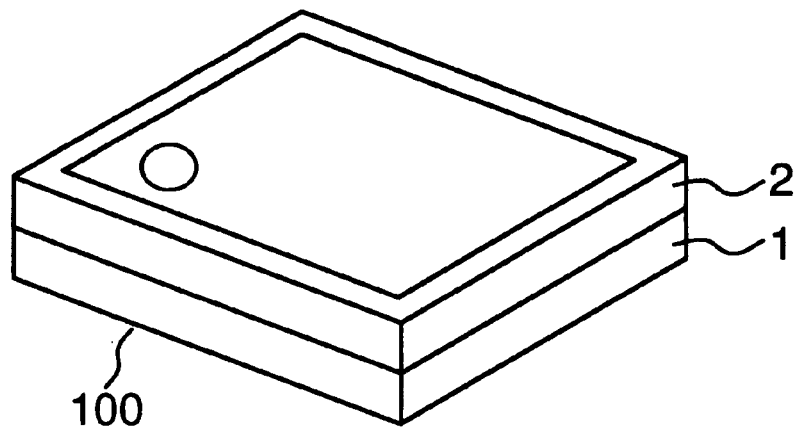
FIG. 1 is a perspective view of the discrete semiconductor device according to the first embodiment of the present invention.

FIG. 1 is a perspective view of a semiconductor device 100 according to the first embodiment, comprising a single-side packaging substrate 1 and a sealing resin 2.

Figure 2A:
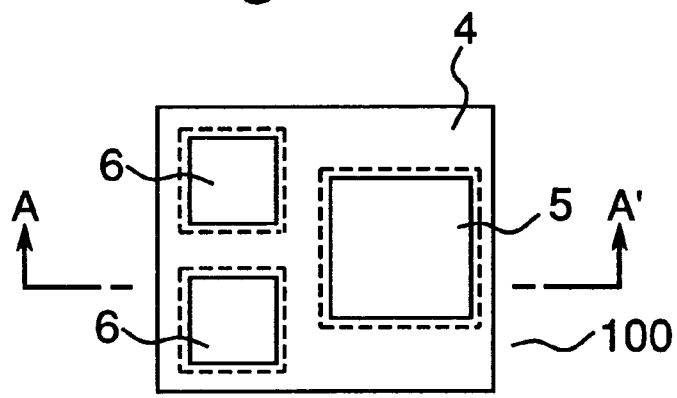
FIG. 2A is a top view of the single-side packaging substrate according to the first embodiment of the present invention.
Figure 2B:
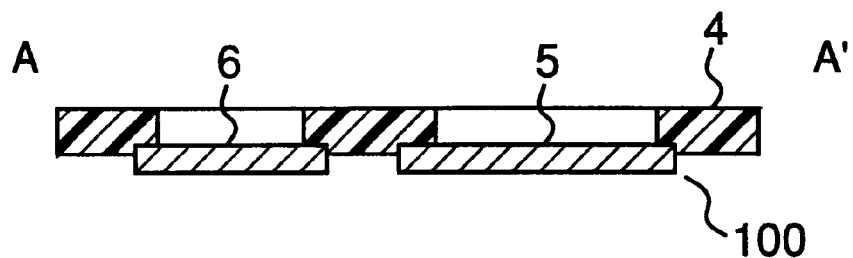
FIG. 2B is a cross sectional view taking in the line A–A' of FIG. 2A.

FIG. 2A is a top view of the single-side packaging substrate 1 before mounting semiconductor chips, and FIG. 2B is a cross sectional view taken in the line A–A'.

The single-side packaging substrate 1 has a copper foil secured thereon by means of an insulating polyimide film 4 having apertures, while the copper foil is exposed on both sides and has outer dimensions of 1.2×1.0×0.55t (mm). Both sides of the copper foil are used to make a die bond pad 5 and wire bond pads 6 which are used as connecting electrodes.

The die bond pad 5 has a discrete semiconductor element 8 fastened on the top face thereof, and Au wires are connected to the top face of the wire bond pads 6. Back faces of the die bond pad 5 and the wire bond pads 6 are used as outside connection terminals for connecting the semiconductor device 100 to a mother board.

Figure 3:
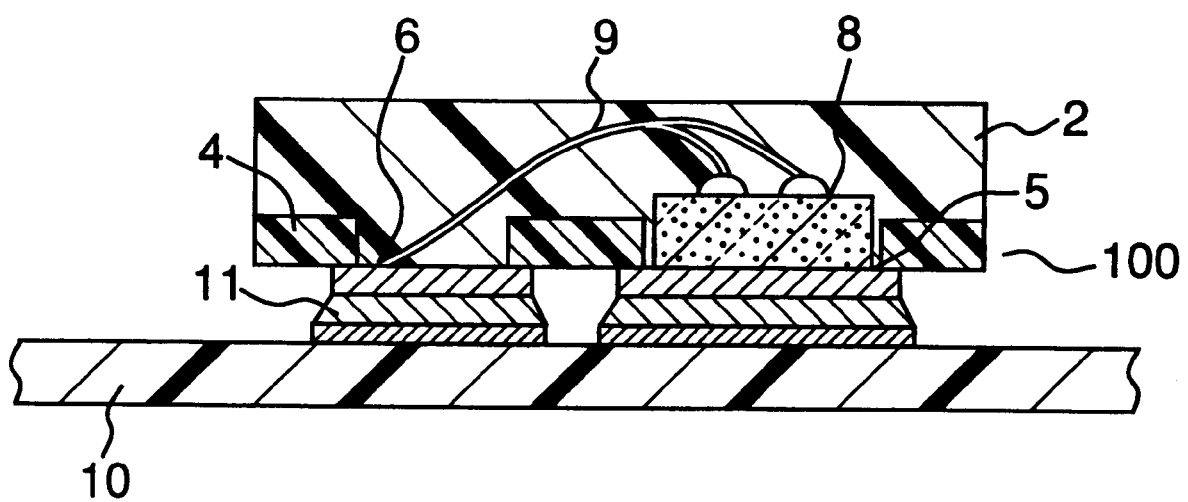
FIG. 3 is a cross sectional view of the discrete semiconductor device according to the first embodiment of the present invention as mounted on the mother board.

FIG. 3 is a cross sectional view of the semiconductor device 100 as mounted on the mother board 10 according to the first embodiment.

In FIG. 3, the discrete semiconductor element 8 is fastened onto the front face of the die bond pad 5 of the single-side wiring substrate 1 via a back side electrode, while a front side electrode of the discrete semiconductor element 8 and the wire bond pads 6 of the single-side packaging substrate 1 are connected with the Au wire 9. An epoxy-based sealing resin 2 is formed on the top surface of the single-side packaging substrate 1 to protect the discrete semiconductor element 8 and the Au wires 9. Back sides of the die bond pad 5 and the wire bond pads 6 of the semiconductor device 100 are connected to connection electrodes provided on the mother board 10 by means of a soldering material 11.

In the semiconductor device 100 configured as described above, because the discrete semiconductor element 8 is directly connected to the mother board 10 via the die bond pad 5 and the wire bond pads 6 made of copper foil having a high thermal conductivity coefficient, heat dissipation performance of the discrete semiconductor element 8 is improved.

Also because the back electrode of the discrete semiconductor element 8 and the die bond pad 5 are directly connected while the discrete semiconductor element 8 and the wire bond pads 6 are connected via the AU wires 9, and the die bond pad 5 and the wire bond pads 6 are directly connected to the mother board 10, wiring distance can be reduced compared to the prior art where the discrete semiconductor elements 8 are connected to the mother board 10 via leads. Therefore, the loss caused when the discrete semiconductor device 100 is used in a high-frequency band can be reduced thereby making it possible to improve the high-frequency characteristics.

Also because the back face of the discrete semiconductor device 100 can be used as the outside connection terminal to connect directly to the mother board 10, packaging area and height can be made smaller than in such cases that use leads or bump electrodes for connection. Therefore, the mother board 10 carrying the discrete semiconductor device 100 packaged thereon can be made smaller and thinner.

Now the method of producing the discrete semiconductor device 100 according to this embodiment will be described below with reference to FIG. 4 through FIG. 13.

Figure 4:
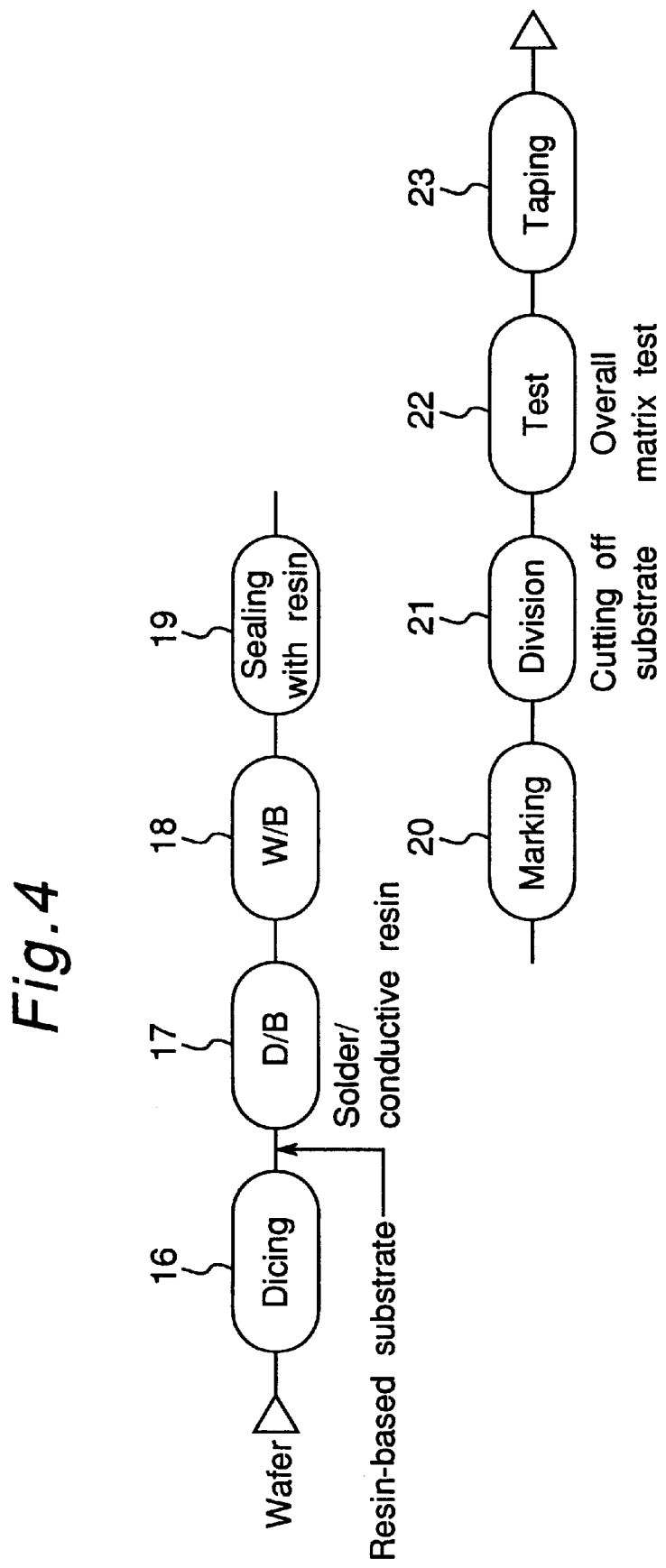
FIG. 4 shows the sequence of assembling steps for the discrete semiconductor device according to the first embodiment of the present invention.
Figure 5:
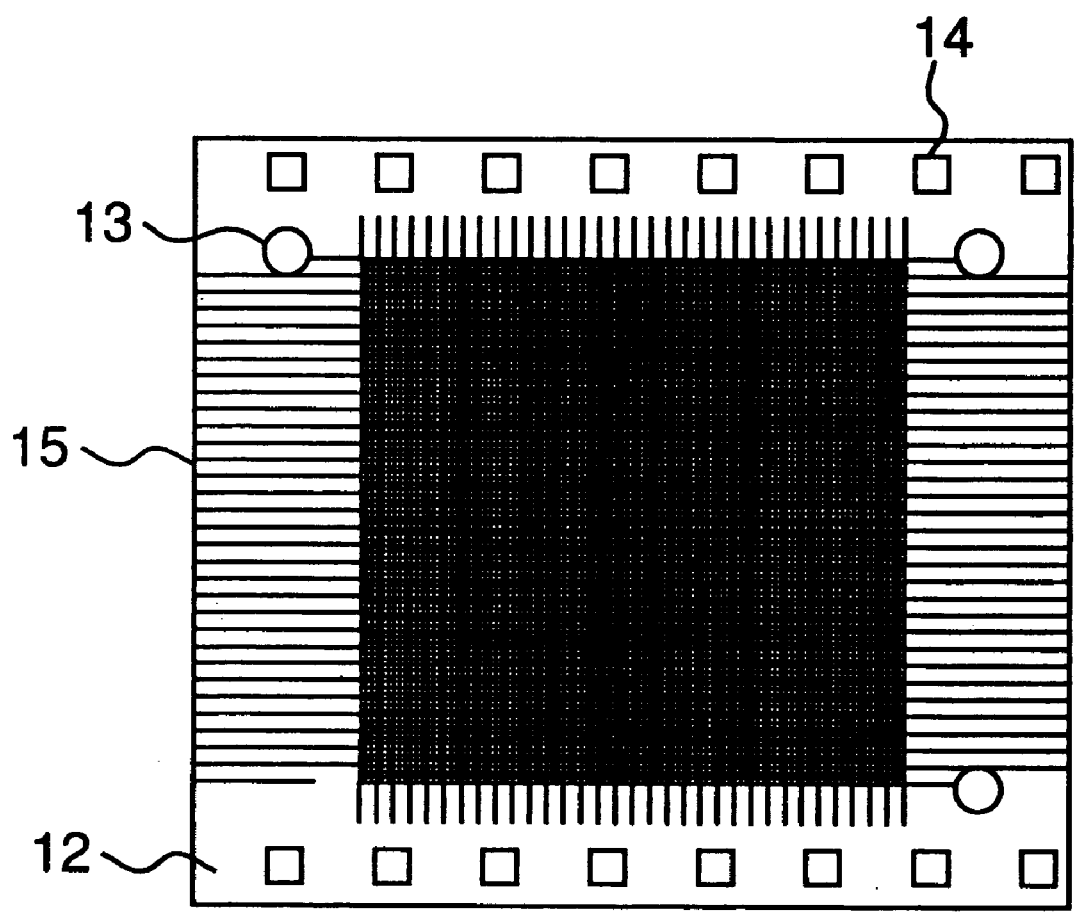
FIG. 5 is a top view of the single-side packaging substrate of sheet form.

FIG. 4 shows the sequence of steps for assembling the discrete semiconductor device 100 according to this embodiment. In FIG. 5, numeral 16 denotes a dicing step where a wafer carrying the discrete semiconductor elements 8 is separated into the discrete semiconductor elements 8. 17 denotes a die bonding step where the discrete semiconductor elements 8 which have been separated are mounted on the die bond pads which are arranged in a matrix configuration. 18 denotes a wire bonding step where the electrodes of the die-bonded discrete semiconductor elements 8 and the wire bond pads 6 are connected with the Au wires 9. 19 denotes a sealing step where the discrete semiconductor elements 8 and the Au wires 9 are sealed with an epoxy-based resin 2. 20 denotes a marking step where the sealing resin on top of the semiconductor device 100 is marked. 21 denotes a dividing step where the substrate in the form of a sheet is divided into discrete semiconductor devices 100. 22 denotes an inspection step for inspecting the discrete semiconductor devices 100. 23 denotes a taping step for putting the discrete semiconductor devices 100 which have passed the inspection in packages.

The discrete semiconductor devices 100 are assembled in the above eight steps.

With the method of producing the discrete semiconductor devices 100 according to this embodiment, first the single-side packaging substrate 1 of sheet form is prepared as shown in FIG. 5. In the drawing, numeral 12 denotes a substrate of sheet form made of polyimide or the like whereon a wiring pattern shown in FIG. 2A is arranged in a matrix configuration. 13 denotes a through hole 2.0 mm in diameter used in positioning of the sheet form substrate 12. 14 denotes a feed hole for feeding the sheet form substrate 12. 15 denotes a cutting line along which the sheet form substrate 12 is to be divided, which is formed by plating on the sheet form substrate 12. The sheet form substrate 12 measures, for example, 35×38×0.075t (mm), and has several hundreds of the wiring patterns, each comprising a set of the die bond pad 5 and the wire bond pads 6, which are arranged in matrix configuration at intervals (about 0.1 mm) of the cutting line 15.

The wiring pattern is formed by bonding electrically conductive metal foils such as copper foil by thermo-compression onto the back face of a sheet member such as polyimide film wherein the apertures are made at specified positions, then etching the metal foils by photolithography technique to leave the metal foils only on the back of the apertures.

Figure 6:
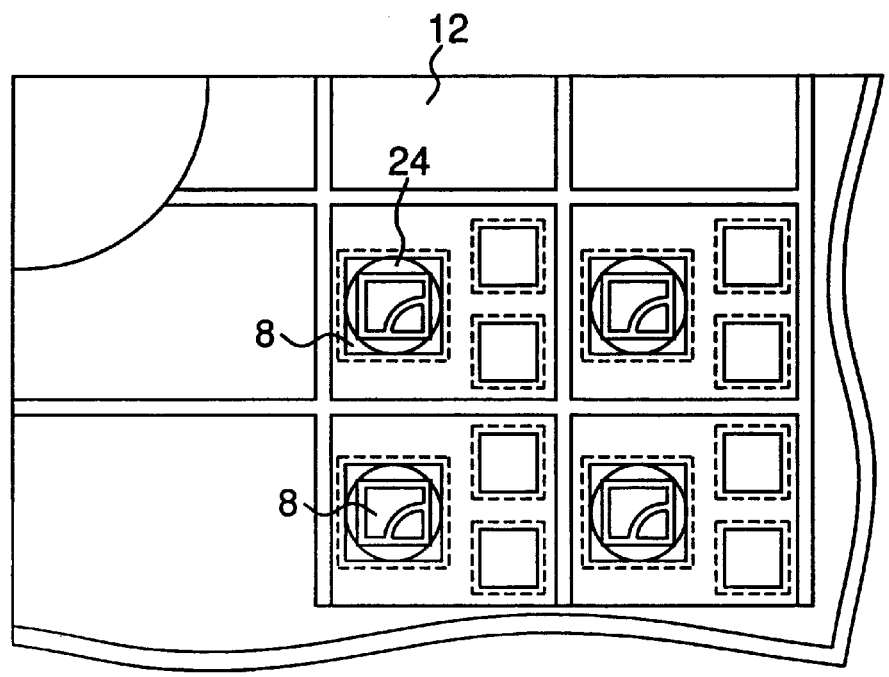
FIG. 6 is a top view of the single-side packaging substrate after the die bonding step.

Then as shown in FIG. 6, the discrete semiconductor elements 8 formed by dicing the wafer are fastened on the die bond pads 5 provided on the sheet form substrate 12 by die bonding with Au epoxy resin 24.

According to this embodiment, because the discrete semiconductor elements 8 have back side electrodes, the back side electrodes and the die bond pads 5 are electrically connected in the die bonding step.

The producing method according to this embodiment can be applied similarly to discrete semiconductor elements which have no back side electrodes.

In the step described above, the discrete semiconductor elements 8 are fastened onto all the die bond pads 5 of the wiring patterns arranged in matrix configuration. While the conventional configuration which uses a lead frame requires it to fasten the discrete semiconductor elements 8 one by one, this embodiment makes it possible to carry out die bonding of all at once thereby reducing the producing steps.

Figure 7:
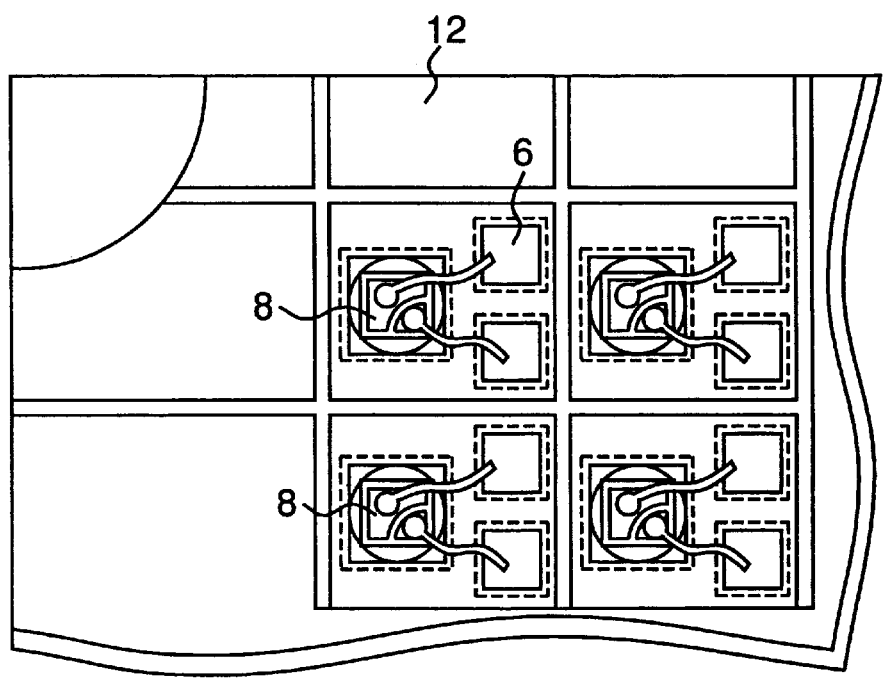
FIG. 7 is a top view of the single-side packaging substrate after the wire bonding step.

Then the electrodes provided on the front face of the discrete semiconductor elements 8 and the wire bond pads 6 provided on the sheet form substrate 12 are electrically connected by using the Au wires 9, as shown in FIG. 7.

Figure 8:
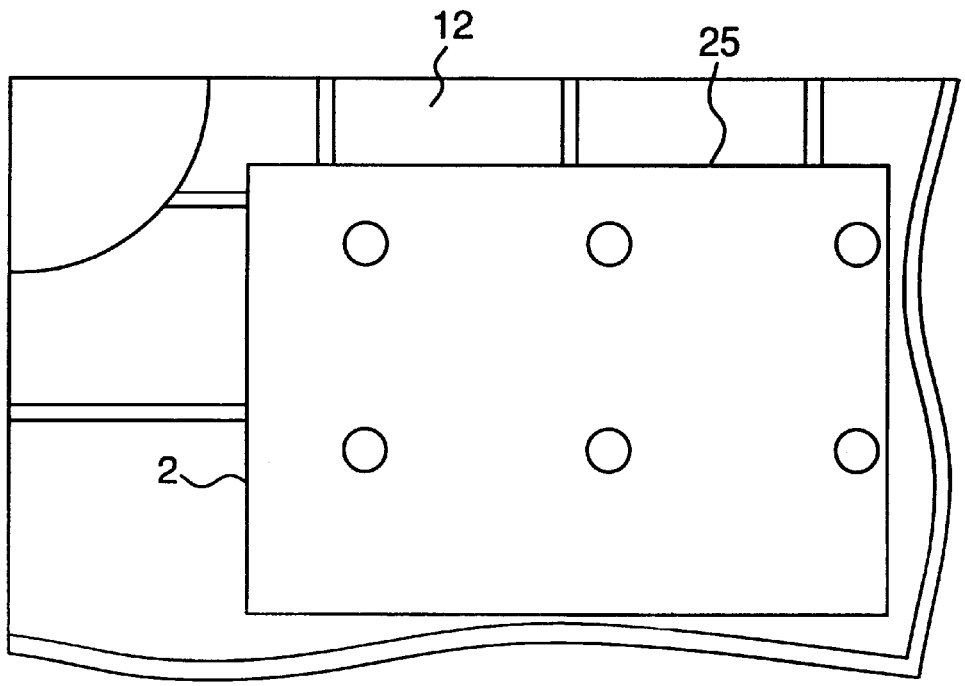
FIG. 8 is a top view of the single-side packaging substrate after the step of sealing with resin.

Then the packaging surface of the sheet form substrate 12 is sealed with resin as shown in FIG. 8. In the sealing step, the epoxy-based sealing resin is melted by heating while being pressurized, and the molten resin is injected into a die cavity placed at a specified position on the sheet form substrate 12. In the drawing, numeral 25 denotes a hole formed on the sealing resin 2 for indicating the orientation of the electrode of the discrete semiconductor device 100.

In the prior art producing method which uses the lead frame, the sealing resin 2 is formed by using an independent die cavity for each of the discrete semiconductor devices 100, while in this embodiment the sealing resin 2 for the several hundreds of semiconductor devices arranged in matrix configuration on the sheet form substrate 12 is formed as an integral body by using one die cavity.

This makes it possible to improve the production tact in the step of sealing with resin and improve the efficiency of producing the sealing resin.

Figure 9A:
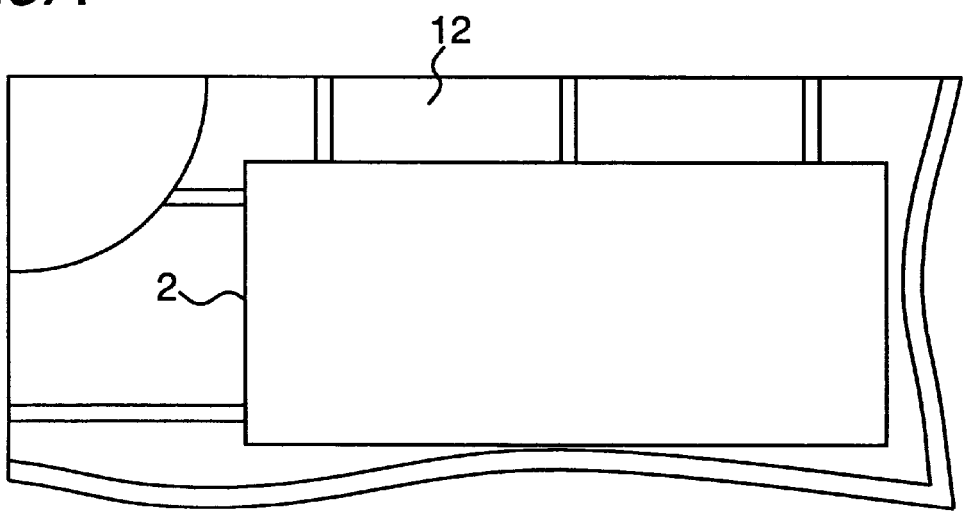
FIG. 9A is a top view of the single-side packaging substrate after the step of sealing with resin.
Figure 9B:
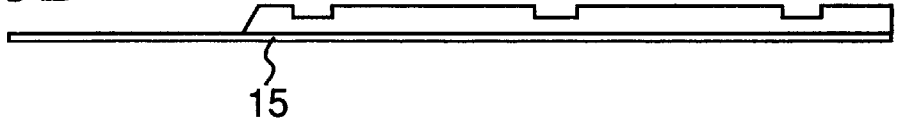
FIG. 9B is a cross sectional view of the single-side packaging substrate after the step of sealing with resin.

Although the hole 25 is formed on the sealing resin 2 as means for indicating the orientation of the electrode of the discrete semiconductor device in FIG. 8, thickness of the sealing resin on one end of the discrete semiconductor device may be made smaller, instead, as shown in FIGS. 9A and 9B (a die cavity of such a configuration is used). Such a configuration makes it possible to use the thin portion of the sealing resin as a cutting portion between the discrete semiconductor devices 100 to be described later, making it easier to cut off and making it possible to confirm the orientation of the electrodes and align the electrodes when a bulk type feeder is used.

Figure 10:
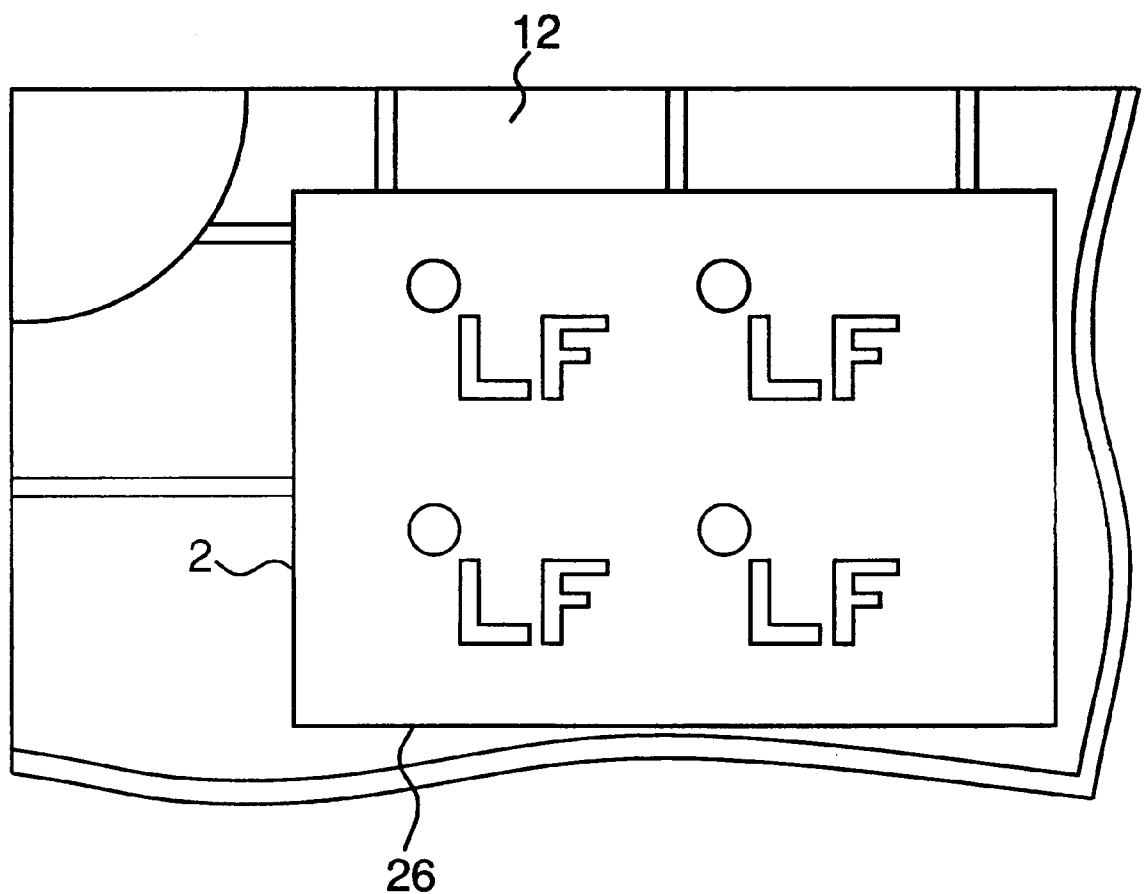
FIG. 10 is a cross sectional view of the single-side packaging substrate after the marking step.

Then a specified string of letters 26 is marked on top of the sealing resin 2 formed on the sheet form substrate 12 by using a marking apparatus such as a laser marker, as shown in FIG. 10. In FIG. 10, letters LF are marked for each discrete semiconductor device.

Figure 11A:
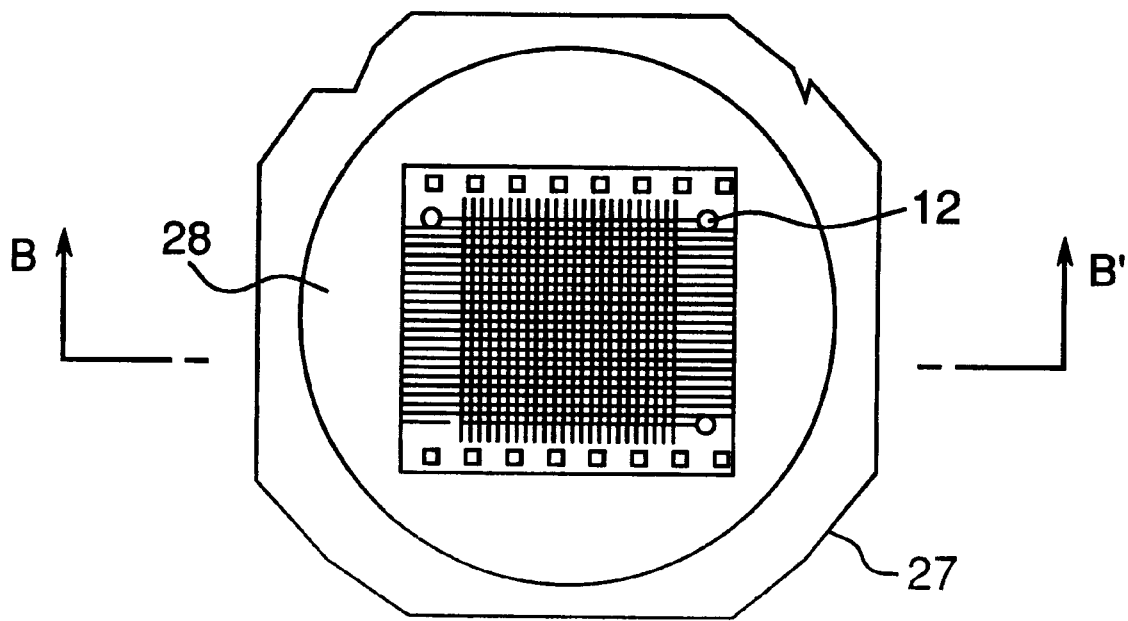
FIG. 11A is a top view after fastening on the frame fixture.
Figure 11B:
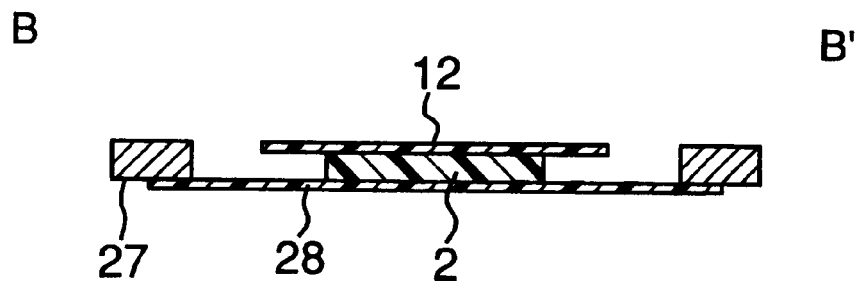
FIG. 11B is a cross sectional view taken in the line B–B' of FIG. 11A.

Then the sheet form substrate 12 is fastened on a frame fixture 27 with the sealing resin 2 side facing down, by using an adhesive tape 28 as shown in FIGS. 11A and 11B, in order to divide the sheet form substrate 12 into the discrete semiconductor devices 100 by using the dicing apparatus. FIG. 11A is a top view of the substrate 12 as fastened on the frame fixture, and FIG. 11B is a cross sectional view taken in the line B–B'.

Figure 12:
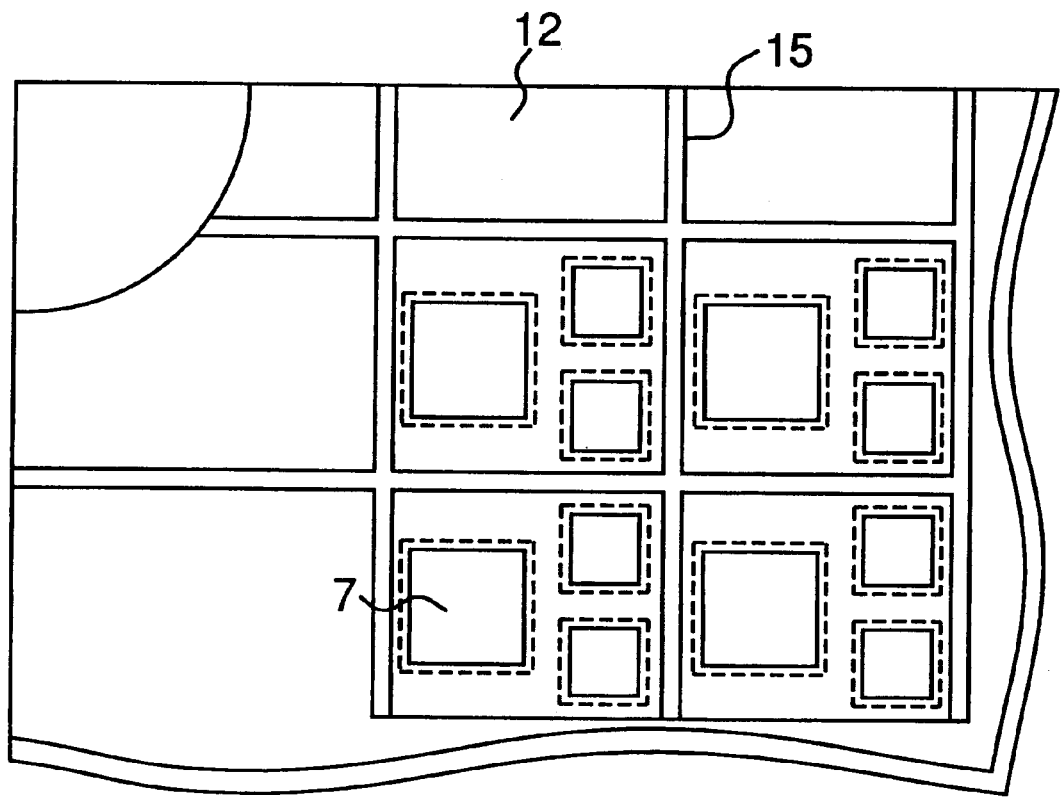
FIG. 12 is a top view of the single-side packaging substrate after the dividing step.

The sheet form substrate 12 fastened on a frame fixture 27 with the adhesive tape 28 is then cut off along the specified cutting line 15 by the dicing apparatus by cutting therein from the back side as shown in FIG. 12, thereby to form the discrete semiconductor devices 100.

With the producing method of this embodiment, because the profile of the semiconductor device is determined not by the die cavity configuration but by the cutting step as described above, the die can be used in common with other models of different configurations. Thus it is not necessary to fabricate the dies for different models, making it possible to reduce the producing cost.

It is also made unnecessary to change the die when switching the model, thus making it possible to improve the production efficiency.

The discrete semiconductor devices 100 which have been cut off are sent to the inspection step, while still being adhered onto the adhesive tape 28. In the inspection step, connection terminals such as contact pins are pressure-bonded onto the outer connection terminals comprising the back faces of the die bond pad 5 and the wire bond pads 6 of the discrete semiconductor device, in a single step for each area. This reduces the inspection time and labor requirement compared to the case of inspecting each semiconductor device one by one.

Figure 13:
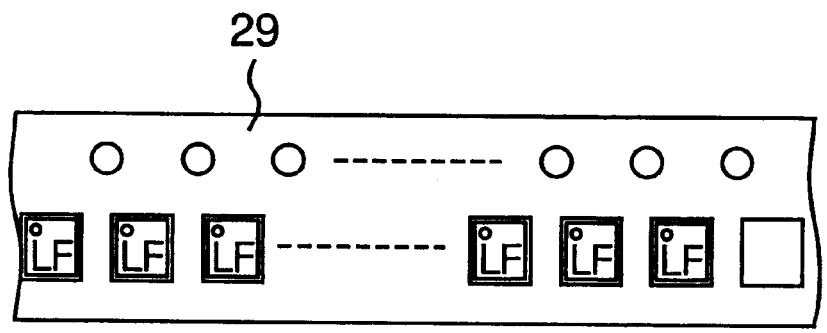
FIG. 13 is a top view after the taping step.

Last, as shown in FIG. 13, only the discrete semiconductor devices which have passed the inspection are removed from the adhesive tape 28 and packaged in a carrier tape. In the drawing, numeral 29 denotes the carrier tape which contains the semiconductor devices. In the case of the semiconductor devices of the prior art which have leads, such reasons as the outer leads protruding from the sealing resin are vulnerable to external forces and the thick sealing resin results in significant height of the semiconductor device preclude the use of carrier tapes made of paper, making it unavoidable to use expensive embossed tapes made of plastics such as polyvinyl chloride and polystyrene.

The discrete semiconductor device of the present invention, on the other hand, does not use leads and is therefore free from such problems as bending or breakage of the leads and the semiconductor device itself is made thinner, so that low cost carrier tapes made of paper can be used. This contributes to the reduction of the consumption of plastics which eventually leads to the saving of natural resources and mitigation of environmental problems.

Embodiment 2

Now second embodiment of the present invention will be described below with reference to the accompanying drawings.

Figure 14:
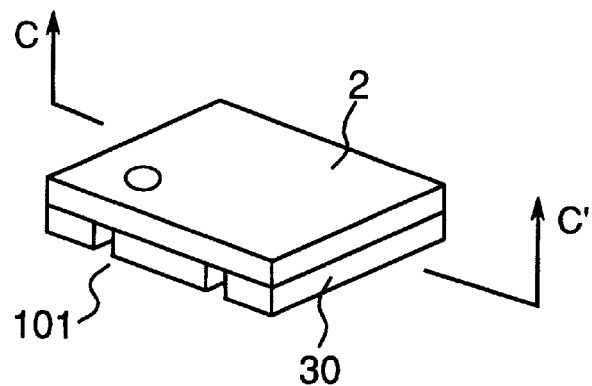
FIG. 14 is a perspective view of the discrete semiconductor device according to the second embodiment of the present invention.

FIG. 14 is a perspective view of a discrete semiconductor device 101 according to the second embodiment which comprises a copper substrate 30 and the sealing resin 2.

Figure 15:
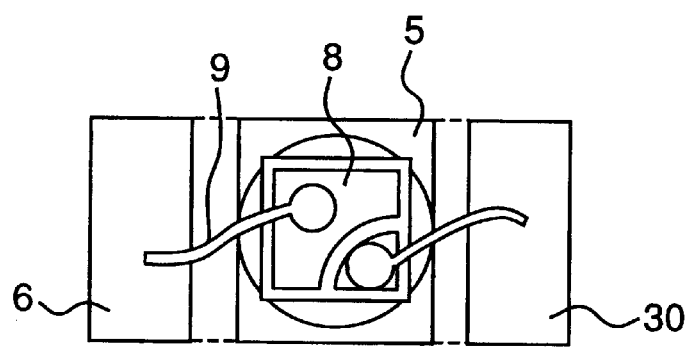
FIG. 15 is a cut-away view from above of the discrete semiconductor device according to the second embodiment of the present invention.

FIG. 15 is a cut-away view from above (with the sealing resin 2 removed) of the discrete semiconductor device 101 according to the second embodiment.

The discrete semiconductor device 101 has dimensions of 1.6×2.1×0.65t (mm), and the copper substrate is 0.1 mm thick.

Figure 16:
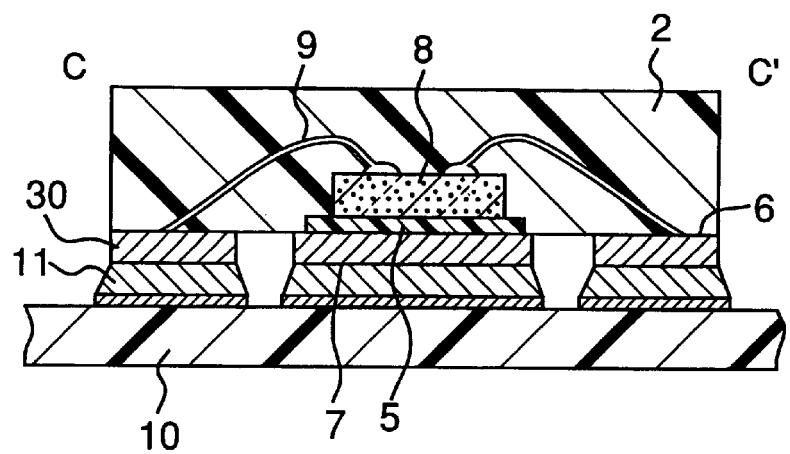
FIG. 16 is a cross sectional view taken in the line C–C' of FIG. 14.

FIG. 16 is a cross sectional view taken in the line C–C' of FIG. 14.

Similarly to the case of the first embodiment, the discrete semiconductor element 8 is mounted on the die bond pad 5 made of copper, while the electrode of the discrete semiconductor element 8 and the wire bond pads 6 are connected with the Au wires 9. The packaging surface is sealed with the epoxy-based resin 2 for the protection of the discrete semiconductor element 8 and the Au wires 9.

The discrete semiconductor device 101 is mounted on the mother board 10 by connecting the outside connection terminals comprising the back sides of the die bond pad 5 and the wire bond pads 6 to the connection electrodes provided on the mother board 10 by means of the solder 11.

In the discrete semiconductor device 101, because the discrete semiconductor element 8 is directly connected to the mother board 10 via the wire bond pads 6 made of copper having a high thermal conduction coefficient, efficiency of heat dissipation can be improved.

Also because the wiring from the discrete semiconductor element 8 to the wire bond pad 6 is made with the length of the Au wire 9, wiring distance can be reduced and the loss caused when the discrete semiconductor device 101 is used in a high-frequency band can be minimized.

Also because the discrete semiconductor device 101 and the mother board 10 are connected not by using bumps but directly by using the back faces of the die bond pad 5 and the wire bond pads 6 as the outer connection terminals, the discrete semiconductor device 101 can be made smaller and thinner.

Now the method of producing the discrete semiconductor device 101 according to this embodiment will be described below with reference to FIG. 17 through FIG. 20.

Figure 17:
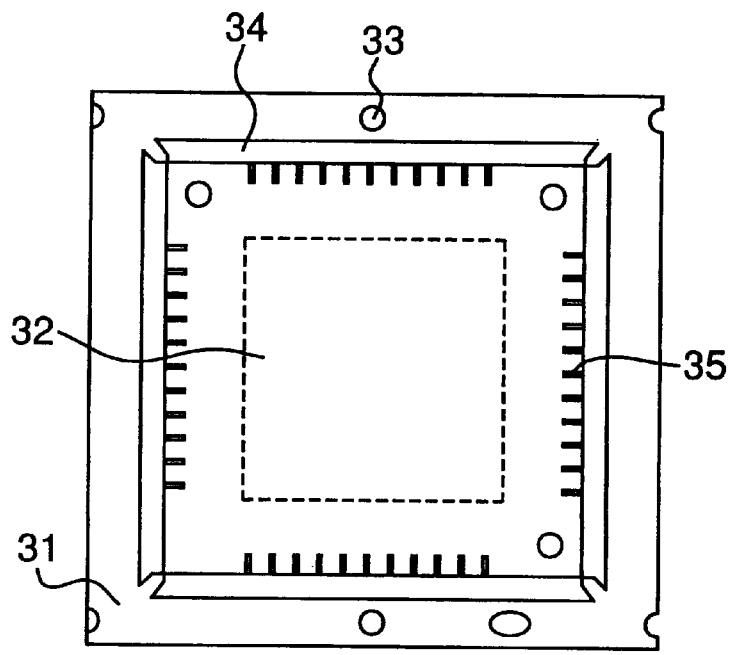
FIG. 17 is a top view of the copper frame.
Figure 18:
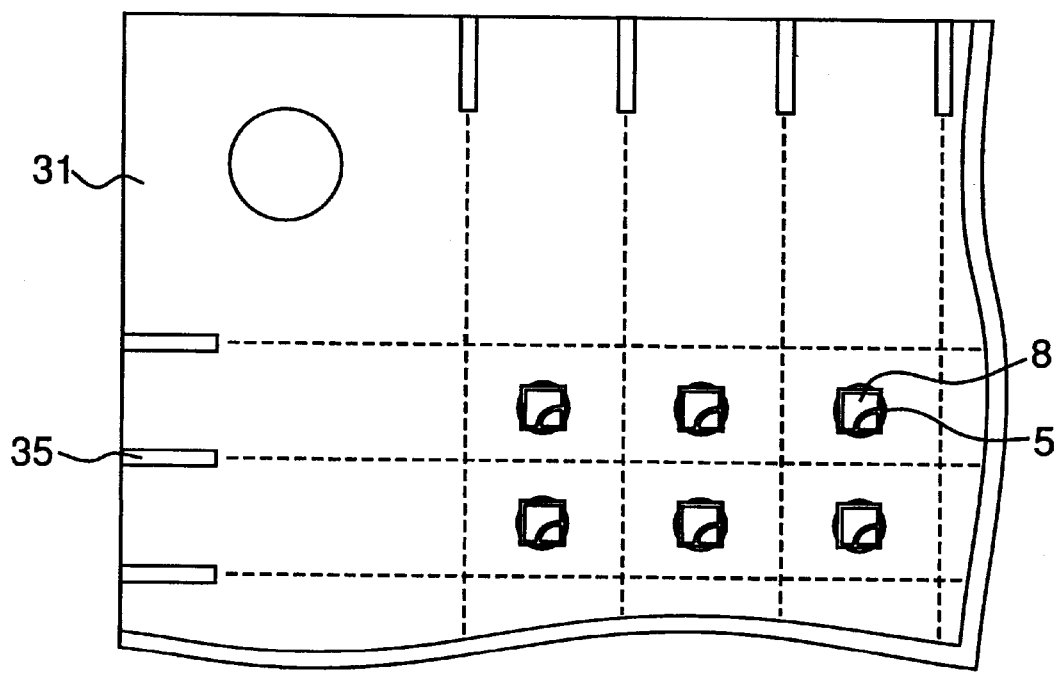
FIG. 18 is a top view after the die bonding step.

With the method of producing the discrete semiconductor device 101 according to this embodiment, a copper frame 31 provided with an assembly area 32 wherein the discrete semiconductor element 8 is to be packaged at the center is prepared as shown in FIG. 17. The assembly area 32 or the copper frame 31 is plated with AgPd or the like for the purpose of packaging chips. Because the copper frame 31 is not provided with wiring pattern for fastening and connecting the discrete semiconductor element 8, it is necessary to predetermine a connecting position for the discrete semiconductor element 8 in advance.

In the drawing, numeral 33 denotes a through hole 2.0 mm in diameter used for positioning of the copper frame. 34 denotes a slit provided for the prevention of thermal deformation of the copper frame 31. 35 denotes a cutting line along which the copper frame 31 is to be cut off, which is a groove cut into the copper frame 31. The copper frame 31 measures 47×47×0.1t (mm), and the assembly area 32 measures 22×22 (mm).

The sequence of assembling steps according to this embodiment is the same as that of the first embodiment shown in FIG. 4.

The discrete semiconductor elements 8 are connected onto specified positions of the copper frame 31 in matrix configuration by die bonding, while using electrically conductive connecting members 24. Positions where the discrete semiconductor elements 8 are connected are those corresponding to the wire bond pads 5 shown in FIG. 15 when the cutting line 35 on the copper frame 31 is regarded as the outline of the discrete semiconductor device. The discrete semiconductor elements 8 in a group can be die-bonded all at once also in the second embodiment as in the first embodiment, and therefore production tacts can be reduced.

Figure 19:
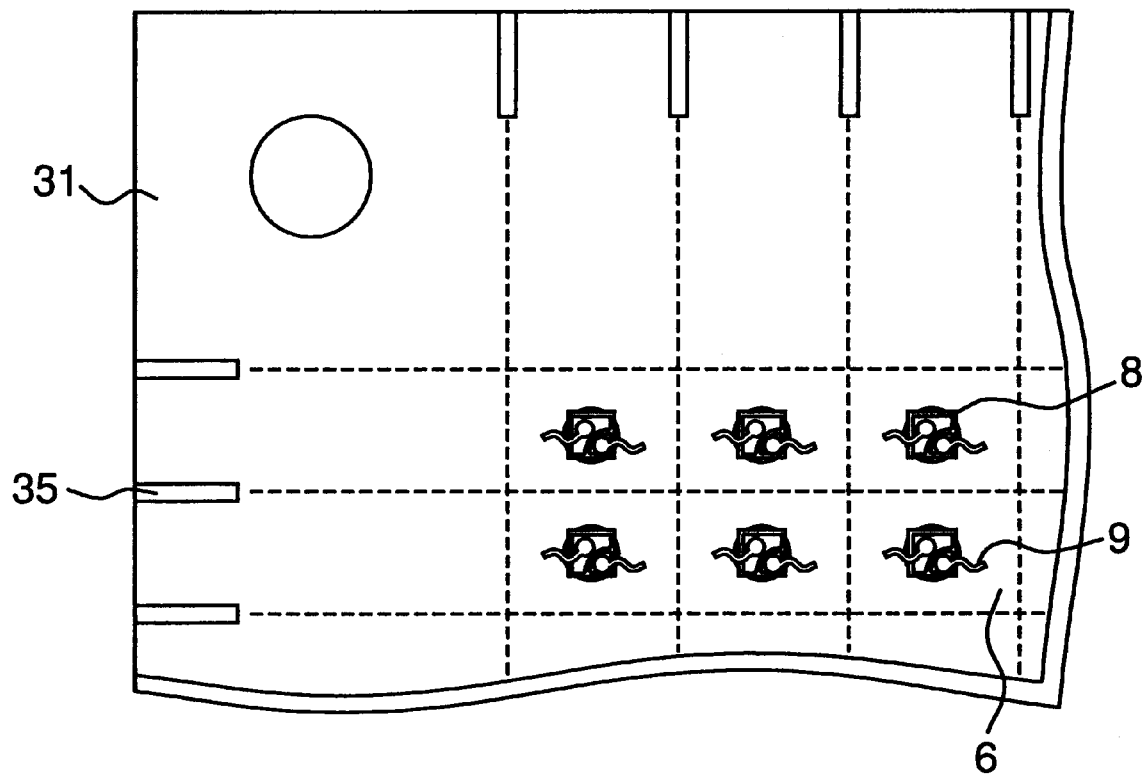
FIG. 19 is a top view after the wire bonding step.

Then the electrodes of the discrete semiconductor elements 8 are electrically connected to specified positions of the copper frame 31 by wire bonding with the Au wires 9, as shown in FIG. 19. Wire bonding is done on both sides of the discrete semiconductor elements 8 located at a distance from the die bonding position of the discrete semiconductor elements 8.

Figure 20:
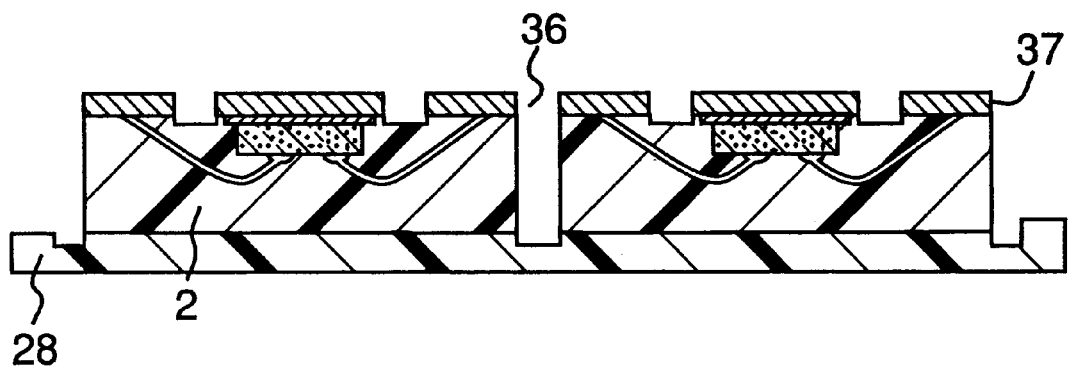
FIG. 20 is a cross sectional view of the discrete semiconductor device after the dividing step.

The packaging surface of the copper frame 31 is sealed with an integral resin in a similar way as in the case of the first embodiment, and marking is done at a specified position on the sealing resin, then the copper frame 31 is cut off as shown in FIG. 20.

The copper frame 31 which has been marked is fastened, with the sealed surface facing down, onto the adhesive tape 28 which is provided on the frame fixture 27 used in the first embodiment, and the copper frame 31 is cut off into the die bond pads 5 and the wire bond pads 6.

In the cutting step, w while the discrete semiconductor devices 100 are separated by cutting only along the cutting line 15 by means of the dicing apparatus in the first embodiment, the copper frame 31 and the sealing resin are cut off to separate the discrete semiconductor devices 101 and at the same time the formation of the die bond pads 5 and the wire bond pads is also carried out by cutting only the copper frame 31, in this embodiment.

In FIG. 20, numeral 36 denotes a cut made by the dicing apparatus for separating the discrete semiconductor devices 101. 37 denotes a cut made by a laser cutter to cut off the copper frame 31 of the discrete semiconductor device 101 and electrically isolate the die bond pad 5 and the wire bond pads.

Last, as in the case of the first embodiment, inspection is carried out and the discrete semiconductor devices 101 which have passed the inspection are removed from the adhesive tape 28 and contained in the carrier tape.

Embodiment 3

Figure 21A:
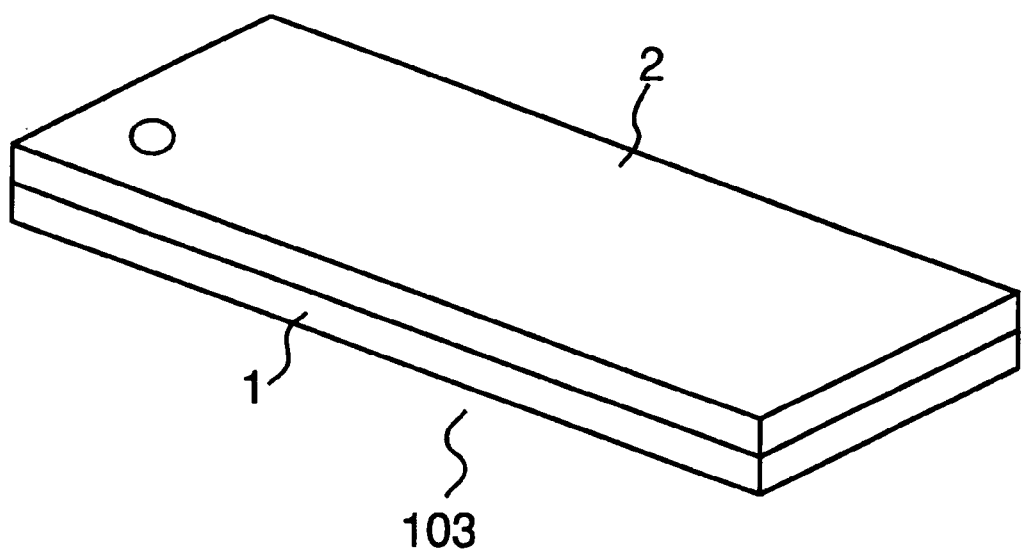
FIG. 21A is a perspective view of the discrete semiconductor device according to the third embodiment of the present invention.
Figure 21B:
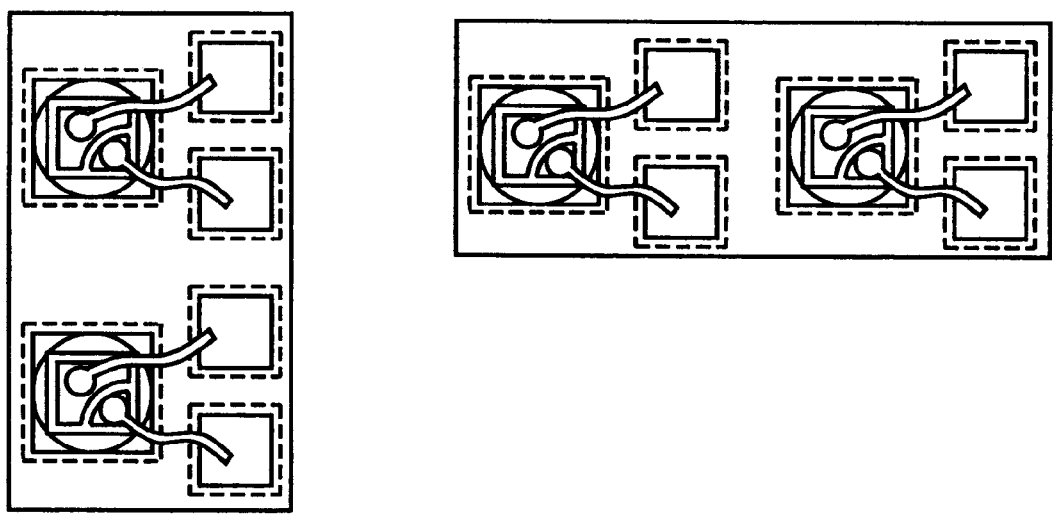
FIG. 21B is a cut-away view from above of the discrete semiconductor device according to the third embodiment of the present invention.

FIG. 21A is a perspective view of a discrete semiconductor device 103 according to the third embodiment. FIG. 21B is a cut-away view from above of the discrete semiconductor device 103 shown in FIG. 21A.

In the discrete semiconductor device 103 according to this embodiment, one discrete semiconductor device 103 carries two discrete semiconductor elements 8 mounted thereon.

That is, in the first embodiment, the discrete semiconductor devices 100 each carrying one discrete semiconductor element 8 is made by cutting around each discrete semiconductor element 8 in the dividing step shown in FIG. 12, while in this embodiment the discrete semiconductor devices 103 each carrying two discrete semiconductor elements 8 can be made by cutting around two discrete semiconductor elements 8, as shown in FIG. 21B.

Thus according to this embodiment, the discrete semiconductor devices 103 each carrying a plurality of discrete semiconductor elements 8 can be made simply by changing the cutting position in the dividing step, thereby making it possible to easily change the discrete semiconductor elements 8 which are packaged and meet the user's requirement.

This makes it possible to further reduce the packaging area and packaging cost for the discrete semiconductor devices 103.

As shown in FIG. 21B, any configuration where the discrete semiconductor elements 8 are arranged in either longitudinal or transverse direction can be easily made by changing the cutting position in the dividing step.

The method according to this embodiment also makes it possible to easily manufacture the discrete semiconductor devices 103 each carrying three or more discrete semiconductor elements 8 arranged therein.

Embodiment 4

Figure 22:
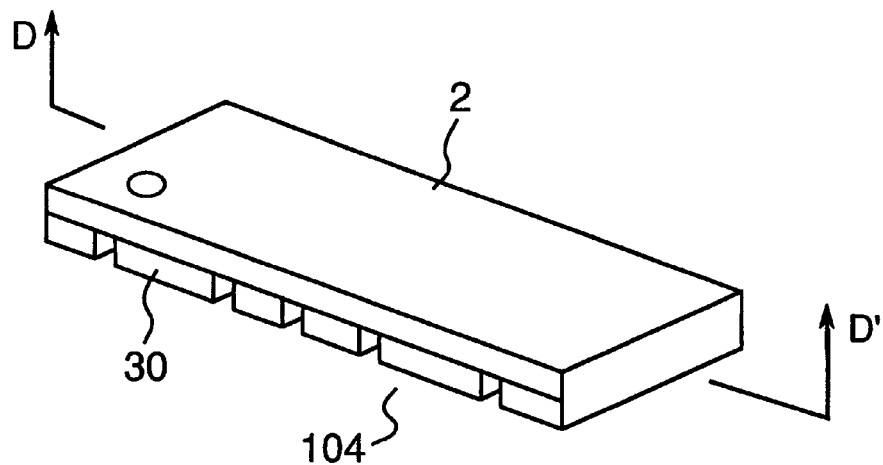
FIG. 22 is a perspective view of the discrete semiconductor device according to the fourth embodiment of the present invention.
Figure 23A:
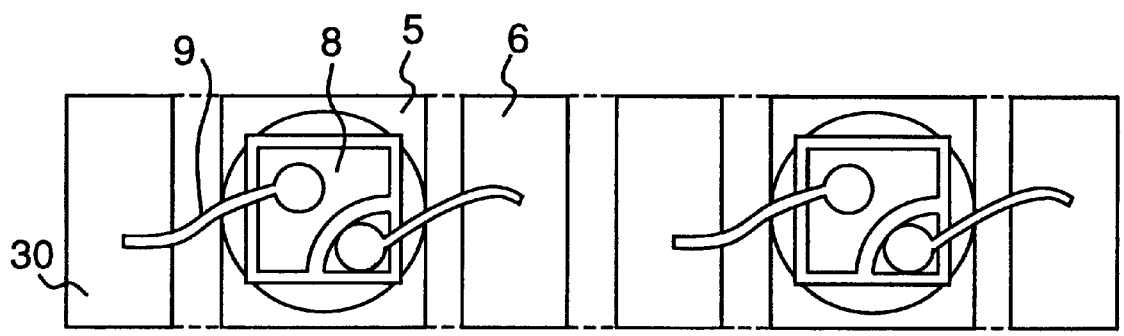
FIG. 23A is a cut-away view from above of the discrete semiconductor device according to the fourth embodiment of the present invention.
Figure 23B:
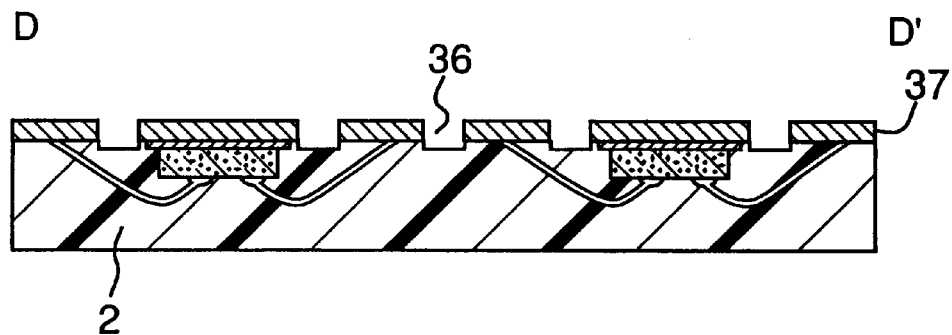
FIG. 23B is a cross sectional view taken in the line D–D' of FIG. 22.

FIG. 22 is a perspective view of a discrete semiconductor device 104 according to the fourth embodiment. FIG. 23A is a cut-away view from above of the discrete semiconductor device 104 according to this embodiment. FIG. 23B is a cross sectional view taken in the line D–D' of FIG. 22.

In the discrete semiconductor device 104 according to this embodiment, too, one discrete semiconductor device 104 carries two discrete semiconductor elements 8 similarly to the case of the third embodiment.

The method for producing the discrete semiconductor device 104 according to this embodiment can easily be achieved by changing the cutting position 36 of the sealing resin and the copper frame 31 in the second embodiment.

That is, in the cutting step of the second embodiment shown in FIG. 20, the sealing resin is cut off while grouping two discrete semiconductor elements 8 in a set, without providing the cutting groove 36 of the sealing resin around each discrete semiconductor element 8.

Thus according to this embodiment, the discrete semiconductor devices 104 each carrying a plurality of discrete semiconductor elements 8 can be made simply by changing the cutting position of the sealing resin in the dividing step, thereby making it possible to change the discrete semiconductor elements 8 which are packaged to meet the user's requirement.

This makes it possible to further reduce the packaging area and the packaging cost for the discrete semiconductor devices 104.

Figure 24A:
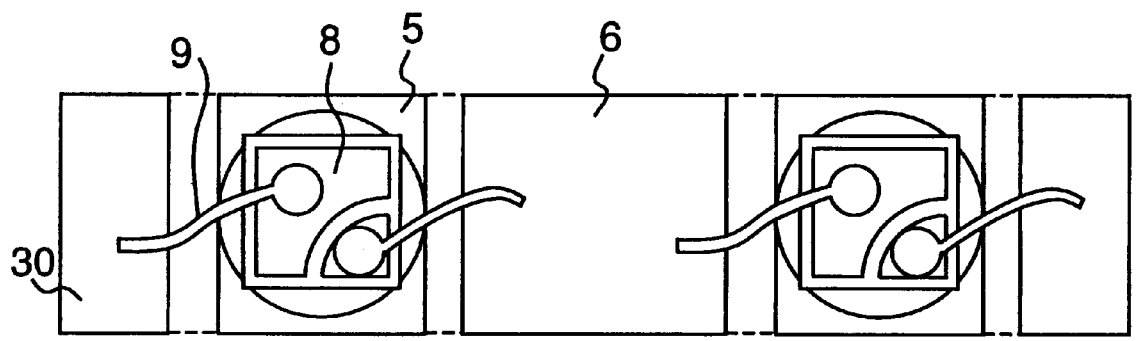
FIG. 24A is a cut-away view from above of another discrete semiconductor device according to the fourth embodiment of the present invention.
Figure 24B:
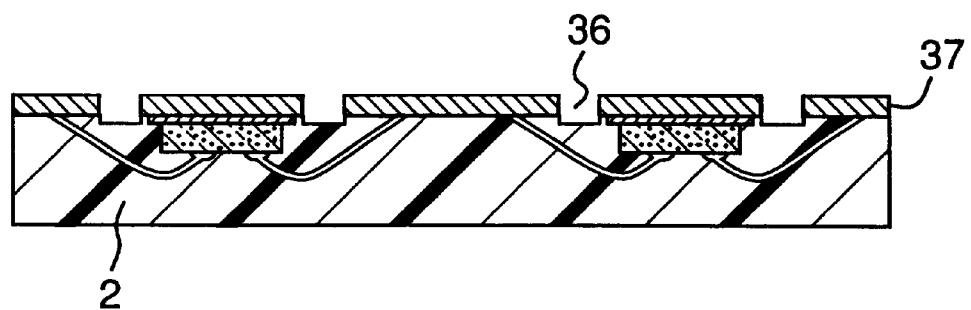
FIG. 24B is a cross sectional view of another discrete semiconductor device according to the fourth embodiment of the present invention.
Figure 25A:
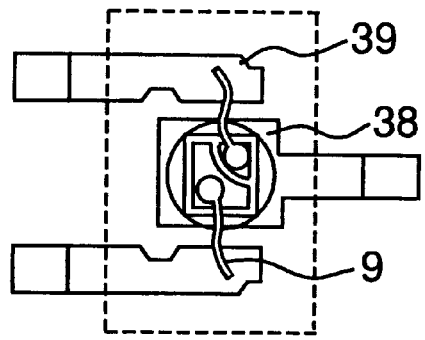
FIG. 25A is a cut-away view from above of the discrete semiconductor device of the prior art.
Figure 25B:
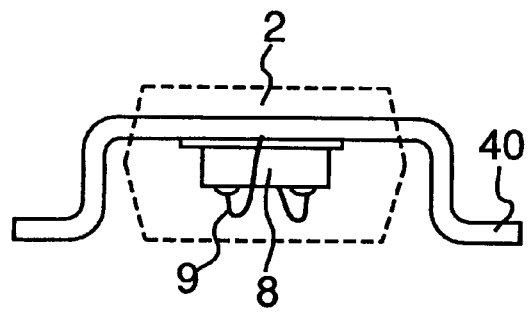
FIG. 25B is a cut-away view from side of the discrete semiconductor device of the conventional configuration.
Figure 26A:
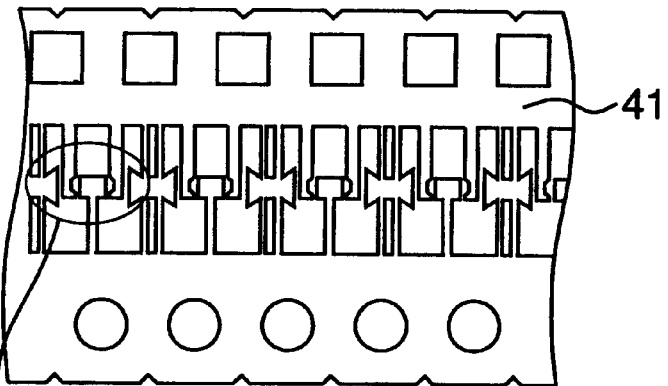
FIG. 26A shows the lead frame used in producing the discrete semiconductor device of the conventional configuration.
Figure 26B:
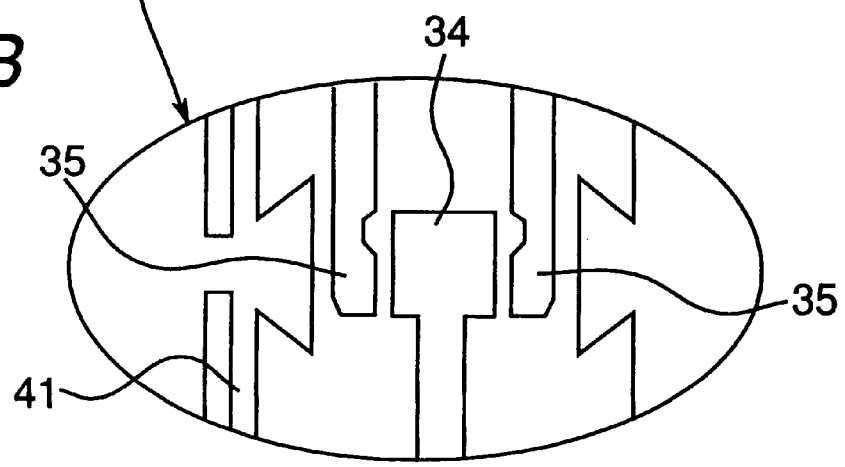
FIG. 26B is a partially enlarged drawing of the lead frame.

FIG. 24A is a cut-away view from above of a discrete semiconductor device 104' according to this embodiment where two discrete semiconductor elements 8 packaged thereon are connected in series using the wire bond pad 6 in common, and FIG. 24B is a cross sectional view thereof.

The discrete semiconductor device 104' can be manufactured without cutting the copper frame 31 located between the two discrete semiconductor elements 8, while using the copper frame 31 as integral wire bond pad 6 common to both discrete semiconductor elements 8.

Thus according to this embodiment, the discrete semiconductor devices 104 each carrying a plurality of discrete semiconductor elements 8 being electrically connected can be made simply by changing the cutting position of the sealing resin and a metal sheet in the dividing step and providing a portion where cutting is not done, thereby making it possible to easily change the discrete semiconductor elements 8 which are packaged to meet the user's requirement.

While FIG. 24 shows the discrete semiconductor elements 8 connected in series with the wire bond pads 6 being formed in common, it is also possible to connect the discrete semiconductor elements 8 connected in parallel with both the die bond pads 5 and the wire bond pads 6 being formed to be used in common.

Further, such a configuration as three or more discrete semiconductor elements 8 are connected in series or in parallel can also be manufactured with similar method.

What is claimed is:

1. A discrete semiconductor device comprising:

an insulative sheet defining plural apertures;

die bond pads and wire bond pads overlapping respective of the apertures at specified intervals on an outer surface of the insulative sheet, said wire bond pads having an inner surface and an outer surface, discrete semiconductor elements fastened on corresponding inner surfaces of the die bond pads, said discrete semiconductor elements including electrodes electrically connected to respective of the inner surfaces of the wire bond pads, and a sealing resin provided on one side of the die bond pads and the wire bond pads to seal the discrete semiconductor elements.

2. A discrete semiconductor device as claimed in claim 1, wherein the die bond pads and the wire bond pads are electrically conductive metal sheets which are fastened at specified positions on the insulative sheet, and the sealing resin is provided on one side of the die bond pads and the wire bond pads thereby to seal the discrete semiconductor element.

3. A discrete semiconductor device as claimed in claim 2, wherein the plurality of discrete semiconductor elements are sealed with the integral sealing resin.

4. A discrete semiconductor device as claimed in claim 1, wherein the die bond pads and the wire bond pads are formed from metal sheets and the sealing resin is provided on one side of the die bond pads and the wire bond pads thereby to fasten the die bond pads and the wire bond pads at specified intervals and seal the discrete semiconductor element.

5. A discrete semiconductor device as claimed in claim 4, wherein the plurality of discrete semiconductor elements are sealed with the integral sealing resin.

6. A discrete semiconductor device as claimed in claim 4, wherein the plurality of discrete semiconductor elements, having the die bond pads and/or the wire bond pads in common, are sealed with the resin.

7. A discrete semiconductor device as claimed in claim 1, further comprising:

electrodes on a back surface of the discrete semiconductor device and electrically connected to the wire bond pads.

* * * * *